(12) United States Patent
Wang et al.

(10) Patent No.: US 12,322,691 B2
(45) Date of Patent: Jun. 3, 2025

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Chuei-Tang Wang, Taichung (TW); Chun-Lin Lu, Hsinchu (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/420,775

(22) Filed: Jan. 24, 2024

(65) Prior Publication Data
US 2024/0170386 A1    May 23, 2024

Related U.S. Application Data

(63) Continuation of application No. 17/676,826, filed on Feb. 22, 2022, now Pat. No. 11,908,787, which is a (Continued)

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 21/486* (2013.01); *H01L 21/565* (2013.01); *H01L 21/568* (2013.01); *H01L 21/6835* (2013.01); *H01L 23/3128* (2013.01); *H01L 23/49827* (2013.01); *H01L 23/66* (2013.01); *H01L 24/19* (2013.01); (Continued)

(58) Field of Classification Search
CPC ........... H01L 23/49838; H01L 23/3128; H01L 23/49827; H01L 23/66; H01L 23/5389; H01L 21/4857; H01L 21/486; H01L 21/565; H01L 21/568; H01L 21/6835; H01L 24/19; H01L 24/32; H01L 24/73; H01L 24/83; H01L 2223/6616; H01Q 1/2283; H01Q 9/0407; H01Q 9/16
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Dao H Nguyen
(74) *Attorney, Agent, or Firm* — JCIPRNET

(57) ABSTRACT

A package structure includes a conductive feature structure, a die, an adhesive layer, an insulator, a through via, and an encapsulant. The die is disposed over the conductive feature structure. The adhesive layer is disposed below the die. The insulator is disposed between the adhesive layer and a polymer layer of the conductive feature structure. The through via extends through the insulator to connect to the conductive feature structure. The encapsulant is disposed on the insulator and the conductive feature structure, laterally encapsulating the die and the through via, and between the through via and the insulator. The insulator has a coefficient of thermal expansion less than a coefficient of thermal expansion of the encapsulant.

20 Claims, 9 Drawing Sheets

Related U.S. Application Data continuation of application No. 16/513,730, filed on Jul. 17, 2019, now Pat. No. 11,264,316.

(51) Int. Cl.
| | |
|---|---|
| *H01L 21/56* | (2006.01) |
| *H01L 21/683* | (2006.01) |
| *H01L 23/00* | (2006.01) |
| *H01L 23/31* | (2006.01) |
| *H01L 23/66* | (2006.01) |
| *H01Q 1/22* | (2006.01) |
| *H01Q 9/04* | (2006.01) |
| *H01Q 9/16* | (2006.01) |

(52) U.S. Cl.
CPC .............. *H01L 24/20* (2013.01); *H01L 24/32* (2013.01); *H01L 24/73* (2013.01); *H01L 24/83* (2013.01); *H01Q 1/2283* (2013.01); *H01Q 9/0407* (2013.01); *H01Q 9/16* (2013.01); *H01L 2221/68345* (2013.01); *H01L 2221/68359* (2013.01); *H01L 2221/68372* (2013.01); *H01L 2223/6616* (2013.01); *H01L 2223/6677* (2013.01); *H01L 2224/73267* (2013.01); *H01L 2224/83005* (2013.01); *H01L 2924/3511* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 11,264,316 B2 * | 3/2022 | Wang | H01L 23/49827 |
| 11,908,787 B2 * | 2/2024 | Wang | H01L 23/145 |
| 2016/0240492 A1 * | 8/2016 | Wolter | H01L 23/66 |
| 2017/0033063 A1 * | 2/2017 | Lin | H01L 24/20 |
| 2017/0250138 A1 * | 8/2017 | Hsieh | H01L 21/486 |
| 2018/0151538 A1 * | 5/2018 | Hung | H01L 25/50 |

* cited by examiner

PACKAGE STRUCTURE AND METHOD OF MANUFACTURING THE SAME

CROSS-REFERENCE TO RELATED APPLICATION

This application is a continuation application of and claims the priority benefit of a prior U.S. application Ser. No. 17/676,826, filed on Feb. 22, 2022. The prior U.S. application Ser. No. 17/676,826 is a continuation application of and claims the priority benefit of a prior U.S. application Ser. No. 16/513,730, filed on Jul. 17, 2019. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
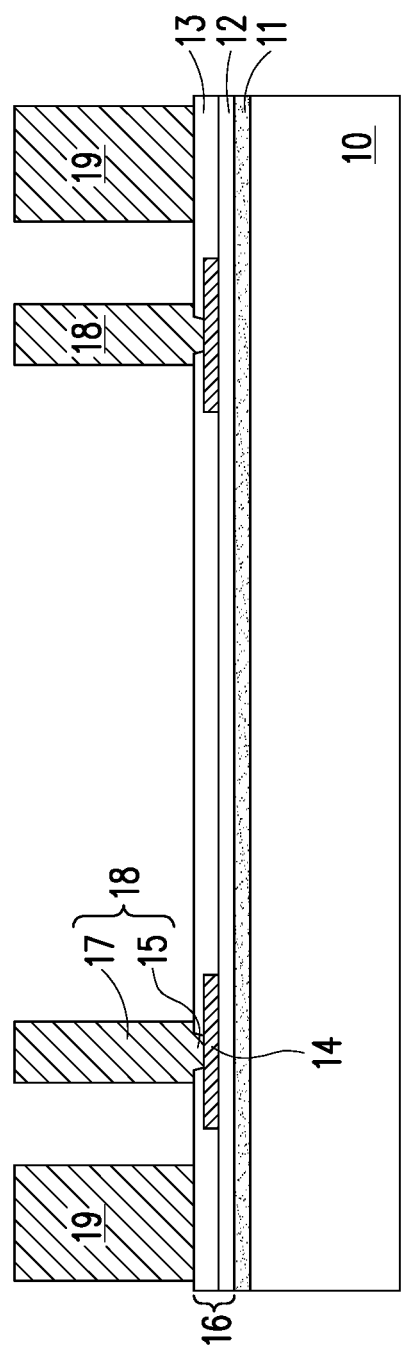
FIG. 1A to FIG. 1H are schematic cross-sectional views illustrating a method of forming a package structure according to some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a method of forming a package structure according to a first embodiment of the disclosure. In some embodiments, the package structure is a fan-out package structure, and may or may not include antennas.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent processes.

A redistribution layer (RDL) structure 16 is formed over the carrier 10. In some embodiments, the RDL structure 16 includes conductive features and polymer layers. For example, the RDL structure 16 includes a polymer layer 12, a polymer layer 13, and a conductive layer 14. The polymer layer 12 is disposed on the de-bonding layer 11. The conductive layer 14 is disposed on the polymer layer 12 and embedded in the polymer layer 13. The polymer layer 13 is disposed on the polymer layer 12 and the conductive layer 14, covering the top surface of the polymer layer 12, the top surface and sidewalls of the conductive layer 14. The number of the polymer layers or the conductive layers shown in FIG. 1A is merely for illustration, and the disclosure is not limited thereto.

In some embodiments, the polymer layers 12 and 13 respectively includes polybenzoxazole (PBO), polyimide (PI), benzocyclobutene (BCB), combinations thereof or the like, but the disclosure is not limited thereto. In some other embodiments, the polymer layers 12 and 13 may also include inorganic dielectric material. The inorganic dielectric material may include a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The materials of the polymer layers 12 and 13 may be the same or different. The forming methods of the polymer layers 12, 13 include suitable fabrication techniques such as spin coating, chemical vapor deposition (CVD), plasma-enhanced chemical vapor deposition (PECVD), lamination or the like.

In some embodiments, the conductive layer 14 includes conductive materials. The conductive material includes metal such as copper, nickel, titanium, a combination thereof or the like, and is formed by an electroplating process. In some embodiments, the conductive layer 14 include a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. However, the disclosure is not limited thereto.

In some embodiments, the conductive layer 14 includes conductive lines or traces extending on the top surface of the polymer layer 12. The conductive layer 14 may be referred to as a redistribution layer (RDL). In some embodiments, the conductive layer 14 may include feed lines and a ground plane (not shown) for antenna elements. For example, the feed lines of the conductive layer 14 may be electrically connected to other subsequently formed conductive elements for signal transmission, and the ground plane of the conductive layer 14 may be electrically connected to a ground.

Still referring to FIG. 1A, a plurality of through integrated fan-out vias (TIVs) 18 and 19 are formed on the RDL structure 16. The materials of the TIVs 18 and the TIVs 19 may be the same or different. In some embodiments, the TIVs 18 and 19 include copper, nickel, solder, alloys thereof, or the like, respectively. In some embodiments, the TIVs 18 and 19 respectively includes a seed layer and a conductive layer formed thereon (not shown). The seed layer is, for example, a titanium or/and copper composited layer. The conductive layer is, for example, a copper layer. In some other embodiments, the TIVs 18 and 19 further include a barrier layer (not shown) under the seed layer to prevent metal diffusion. The material of the barrier layer includes, for instance, metal nitride such as titanium nitride, tantalum nitride, or a combination thereof.

In some embodiments, the TIVs 18 penetrates through the polymer layer 13 to be in electrical contact with the conductive layer 14. The TIV 18 may include a conductive via 15 and a conductive post 17 on the conductive via 15. The conductive via 15 is embedded in the polymer layer 13 and the conductive post 17 is disposed on the top surface of the polymer layer 13. The sidewalls of the conductive via 15 and the conductive post 17 may be straight, inclined, arced, or the like, respectively. In some embodiments, the shape of the conductive via 15 may be trapezoid, square, rectangle, or the like. The conductive via 15 may be tapered toward the conductive layer 14. The conductive post 17 may be cylindrical in form or pillars having square or rectangle cross-sectional shape. However, the disclosure is not limited thereto.

A forming method of the TIVs 18 may include the following processes: after the polymer layer 13 is formed, patterning the polymer layer 13 to form via holes exposing a portion of the top surface of the conductive layer 14. A seed layer is formed on the polymer layer 13 to cover the top surface of the polymer layer 13 and the inner surfaces of the via holes. Thereafter, a patterned mask layer is formed on the seed layer. The patterned mask layer has openings exposing a portion of the seed layer in the via hole and on the polymer layer 13. Thereafter, conductive layers are then formed in the openings. The patterned mask layer is stripped, and the seed layer not covered by the conductive layers is removed. As such, the conductive layer and the underlying seed layer form the TIVs 18, wherein the conductive layer and the seed layer on the polymer layer 13 form the conductive posts 17, the conductive layer and the seed layer in the via hole form the conductive vias 15.

In the forming method described above, the conductive vias 15 and the conductive posts 17 are formed simultaneously, and together constitute the TIVs 18. However, the disclosure is not limited thereto. In some alternative embodiments, the conductive vias 15 and the conductive posts 17 may be formed sequentially, the conductive vias 15 may be a part of the RDL structure 16, and the top surface of conductive via 15 is substantially coplanar with the top surface of the polymer layer 13 or protrudes from the top surface of the polymer layer 13. The conductive posts 17 formed on the conductive vias 15 may be referred to as a TIV.

In some embodiments, the TIVs 19 may be formed by the same forming method as that of the TIVs 18, and may be formed simultaneously with the TIVs 18, but the disclosure is not limited thereto. In some alternative embodiments, the TIVs 19 may be formed by pick and place pre-fabricated TIVs onto the polymer layer 13. In some embodiments, the TIVs 19 are disposed on the polymer layer 13 without penetrating through the polymer layer 12 and are not in physical contact with the conductive layer 14. In some embodiments, the TIVs 19 are arranged to form a plurality of dipole antennas. For example, each dipole antenna includes dipole arms which may be bilaterally symmetrical conductive elements. In some embodiments, each of the dipole antennas has two L-shaped dipole arms in a top view. As illustrated in FIG. 1A, the TIVs 19 have a dimension (e.g. width) greater than that of the TIVs 18, but the disclosure is not limited thereto. In some alternative embodiments, the TIVs 19 may have a dimension (e.g. width) substantially equal to or less than that of the TIVs 18. However, the shapes of the TIVs 18 and the TIVs 19 are not limited in the disclosure. In some embodiments, the TIVs 18 may be disposed between the TIVs 19 and the subsequently-disposed die 30 (as shown in FIG. 1C). The top surfaces of the TIVs 18 and 19 may be coplanar with each other or at different level. In some alternative embodiments, the TIVs 19 may be omitted. The formation of the TIVs 19 may be optional depending on the product requirements.

Figure 1B:
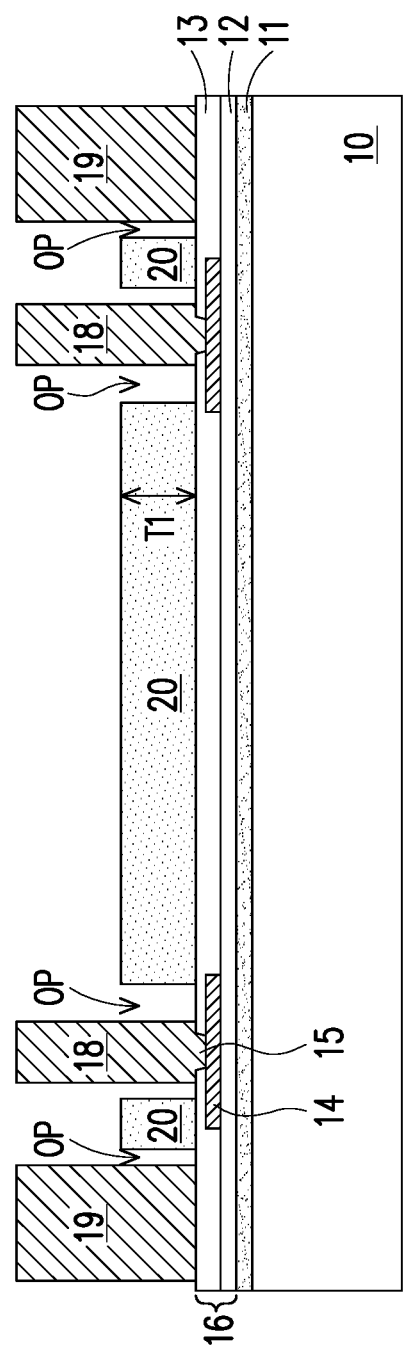
Figure 1C:
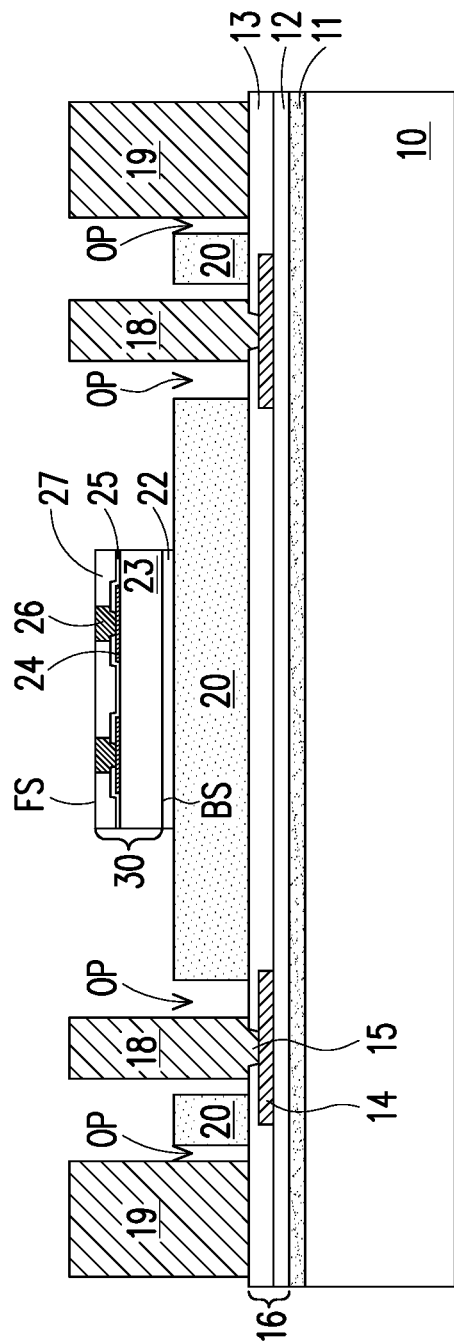

Referring to FIG. 1B, in some embodiments, after the TIVs 18 and 19 are formed, a film 20 is formed on the RDL structure 16 and laterally aside the TIVs 18 and 19. The film 20 is a patterned film which includes a plurality of openings OP surrounding the TIVs 18 and 19. The locations of the openings OP corresponds to the locations of the TIVs 18 and 19, and the dimension of the opening OP may be larger than the corresponding TIV 18 or 19. In some embodiments, one opening OP corresponds to one TIV 18 or 19. In alternative embodiments, one opening OP corresponds to two or more TIVs 18 or 19. The number of the openings OP may be less than, the same as or larger than the number of the TIVs 18 and 19. In other words, the film 20 is spaced from the TIVs 18 and 19 by the openings OP, and the TIVs 18 and 19 are located within the openings OP of the film 20, the sidewalls of the TIVs 18 and 19 are exposed by the openings OP. In some embodiments, the TIV 18 or 19 may be centered in the opening OP, but the disclosure is not limited thereto. The TIV 18 or 19 may be located in any location within the opening OP. The horizontal distances between different locations of the sidewall of each TIV 18 or 19 to the sidewall of the film 20 may be the same or different.

In some embodiments, the film 20 includes a core dielectric material. In some embodiments, the film 20 includes one or more material selected from epoxy, resin, glass fiber, prepreg (which comprises epoxy, resin, and/or glass fiber), resin coated copper (RCC), glass, plastic (such as polyVinylChloride (PVC), acrylonitril, butadiene & styrene (ABS), polypropylene (PP), polyethylene (PE), polyStyrene (PS), polymethyl Methacrylate (PMMA), polyethylene terephthalate (PET), polycarbonates (PC), polyphenylene sulfide (PPS), polyimide, combinations thereof, or multi-layers thereof. In some embodiments, the film 20 is a comparable CTE material having a coefficient of thermal expansion (CTE) in a suitable range. In some embodiments, the film 20 is used to reduce the CTE mismatch between the subsequently disposed die and encapsulant. The materials of the film 20 described above are merely for illustration, and the disclosure is not limited thereto. The film 20 may be formed of any suitable material as long as it has a suitable CTE.

In some embodiments, the film 20 is formed by the following process: a pre-formed film material layer is provided. The film material layer has a same shape as that of the carrier 10, for example. The film material layer is then patterned by a suitable process, such as a mechanical punching process, such that the openings OP penetrating through the film 20 are formed. The patterning process is performed according to the layout of the TIVs 18 and 19, such that the openings OP are at the locations corresponding to those of the TIVs 18 and 19. Thereafter, the punched film material layer is laminated or attached on the RDL structure 16. In some embodiments, the film 20 is a single layer structure, but the disclosure is not limited thereto. In alternative embodiments, the film 20 is a multi-layer structure formed by multiple punching and lamination processes. The forming method of the film 20 described above is merely for illustration, and the disclosure is not limited thereto. In some other embodiments, the film 20 may be formed by deposition process and patterning process such as photolithograph and etching processes.

Still referring to FIG. 1B, the film 20 may have a thickness T1 larger than 70 µm, such as in a range of 90 µm to 100 µm, but the disclosure is not limited thereto. In some embodiments, the film 20 may have substantially uniform thickness across the top surface of the RDL structure 16. In alternative embodiments, the film 20 may have different thicknesses in different regions over the RDL structure 16. For example, the film 20 in a die region may be thicker than the film 20 in the regions other than the die region. The die region referred to a region on which a die is to be disposed subsequently.

Referring to FIG. 1C, a die 30 is mounted on the film 20 by pick and place process. In some embodiments, the die 30 is attached to the film 20 through an adhesive layer 22 such as a die attach film (DAF), silver paste, or the like. In some embodiments, the die 30 is one of a plurality of dies cut apart from a wafer, for example. The die 30 may be an application-specific integrated circuit (ASIC) chip, an analog chip, a sensor chip, a wireless and radio frequency chip, a voltage regulator chip or a memory chips. The number of the die 30 shown in FIG. 1C is merely for illustration, and the disclosure is not limited thereto. In some embodiments, two or more dies 30 may be mounted on the film 20 over the carrier 10, and the two or more dies 30 may be the same types of dies or the different types of dies.

Still referring to FIG. 1C, the die 30 is disposed on the film 20 and laterally between the TIVs 18 and 19, that is, the TIVs 18 and 19 are laterally aside or around the die 30. In some embodiments, the die 30 includes a substrate 23, a plurality of pads 24, a passivation layer 25, a plurality of connectors 26 and a passivation layer 27. In some embodiments, the substrate 23 is made of silicon or other semiconductor materials. Alternatively or additionally, the substrate 23 includes other elementary semiconductor materials such as germanium, gallium arsenic, or other suitable semiconductor materials. In some embodiments, the substrate 23 may further include other features such as various doped regions, a buried layer, and/or an epitaxy layer. Moreover, in some embodiments, the substrate 23 is made of an alloy semiconductor such as silicon germanium, silicon germanium carbide, gallium arsenic phosphide, or gallium indium phosphide. Furthermore, the substrate 23 may be a semiconductor on insulator such as silicon on insulator (SOI) or silicon on sapphire.

In some embodiments, a plurality of devices are formed in or on the substrate 23. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure are formed over the devices on the substrate 23. The interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 24 may be or electrically connected to a top conductive feature of the interconnection structure, and further electrically connected to the devices formed on the substrate 23 through the interconnection structure. The material of the pads 24 may include metal or metal alloy, such as aluminum, copper, nickel, or alloys thereof.

The passivation layer 25 is formed over the substrate 23 and covers a portion of the pads 24. A portion of the pads 24 is exposed by the passivation layer 25 and serves as an external connection of the die 30. The connectors 26 are formed on and electrically connected to the pads 24 not covered by the passivation layer 25. The connector 26 includes solder bumps, gold bumps, copper bumps, copper posts, copper pillars, or the like. The passivation layer 27 is formed over the passivation layer 25 and laterally aside the connectors 26 to cover the sidewalls of the connectors 26. The passivation layers 25 and 27 respectively include an insulating material such as silicon oxide, silicon nitride, polymer, or a combination thereof. The polymer may include polybenzoxazole (PBO), polyimide (PI), benzocyclobutene (BCB), the like, or combinations thereof. The materials of the passivation layer 25 and the passivation layer 27 may be the same or different. In some embodiments, the top surface of the passivation layer 27 and the top surfaces of the connectors 26 are substantially coplanar with each other.

Still referring to FIG. 1C, in some embodiments, the top surfaces of the passivation layer 27 and the connectors 26 constitute an active surface of the die 30, which may also be referred to as a front surface FS of the die 30. The bottom surface BS of the substrate 23 is referred to as a back surface BS of die 30, which is opposite to the front surface FS. In some embodiments, the back surface BS of the die 30 is attached to and contacts with the adhesive layer 22, while the front surface FS faces up for connecting to the subsequent formed RDL structure. In some embodiments, the front surface FS of the die 30 is lower than the top surfaces of the TIVs 18 and 19, but the disclosure is not limited thereto. In alternative embodiments, the front surface FS may be coplanar with or higher than the top surfaces of the TIVs 18 and 19.

In some embodiments, the die 30 has a CTE less than the CTE of the film 20. It is noted that, the material of the substrate 23 may have a relative high proportion in the whole die 30, and the overall CTE of the die 30 may be close to the CTE of the substrate 23. In other words, the CTE of the film 20 is larger than the CTE of the substrate 23.

Figure 1D:
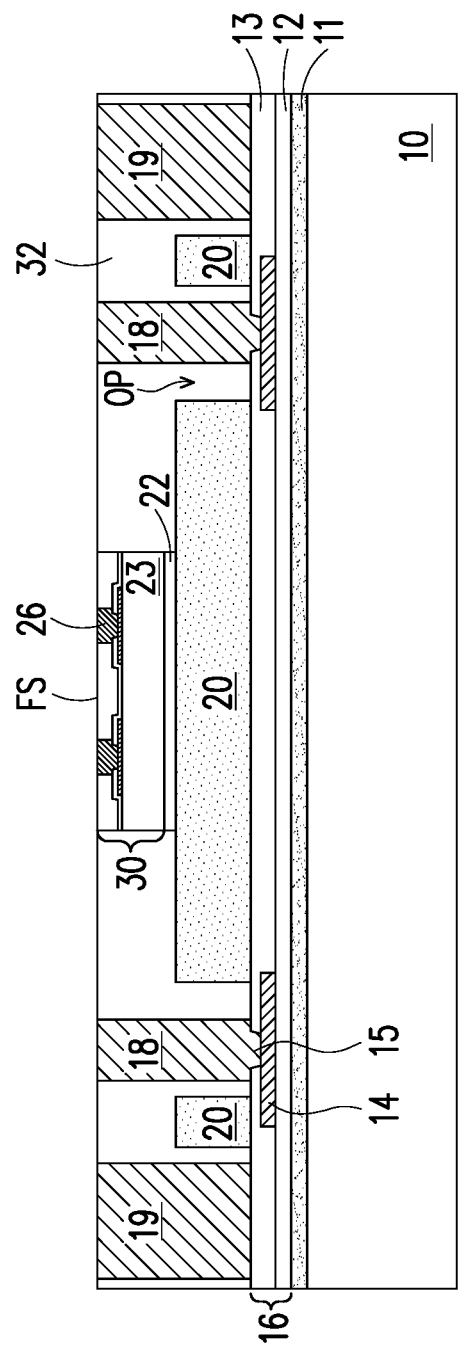

Referring to FIG. 1C and FIG. 1D, an encapsulant 32 is then formed over the carrier 10 to encapsulate the die 30, the TIVs 18 and 19 and the film 20. Specifically, the encapsulant 32 is formed on the polymer layer 13 and the film 20, and fills into the openings OP of the film 20, so as to encapsulate sidewalls of the die 30 and the adhesive layer 22, sidewalls of the TIVs 18 and 19, sidewalls and top surfaces of the film 20. In some embodiments, the encapsulant 32 includes a molding compound, a molding underfill, a resin such as epoxy, a combination thereof, or the like. In some other embodiments, the encapsulant 32 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 32 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 32 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape.

In some embodiments, the encapsulant 32 is formed by forming an encapsulant material layer over the carrier 10 by a suitable fabrication technique such as molding, spin-coating, lamination, deposition, or similar processes. The encapsulant material layer encapsulates the top surfaces and sidewalls of the die 30 and the TIVs 18 and 19. Thereafter, a planarization process such as a grinding or polishing process (such as chemical mechanical polishing (CMP) process) is performed to remove a portion of the encapsulant material layer, such that the top surfaces of the connectors 26 of the die 30 and the TIVs 18 and 19 are exposed. In some embodiments in which the top surfaces of the TIVs 18 and 19 and the front surface FS of the die are not coplanar (as shown in FIG. 1C), portions of the TIVs 18 and 19 or/and portions of the die 30 may also be removed by the planarization process. In some embodiments, after the planarization process, the top surface (such as front surface FS) of the die 30, the top surfaces of the TIVs 18 and 19 and the top surface of the encapsulant 32 are substantially coplanar with each other.

Still referring to FIG. 1D, in some embodiments, a CTE mismatch is existed between the die 30 and the encapsulant 32. For example, the CTE of the encapsulant 32 is larger than the CTE of the die 30. In some embodiments, the CTE of the film 20 is between the CTE of the die 30 and the CTE of the encapsulant 32. For example, the CTE of the film 20 is larger than the CTE of the die 30 and less than the CTE of the encapsulant 32. Therefore, the presence of the film 20 may help reduce the CTE mismatch and thus avoiding or reducing warpage caused by the CTE mismatch. For example, the CTE of the die 30 is less than 10 ppm/° C., such as in the range of 2 ppm/° C. to 10 ppm/° C. The CTE of the encapsulant 32 is larger than 5 ppm/° C., such as in the range of 5 ppm/° C. to 20 ppm/° C. The CTE of the film 20 ranges from 5 to 10 ppm/° C. However, the disclosure is not limited thereto.

Figure 1E:
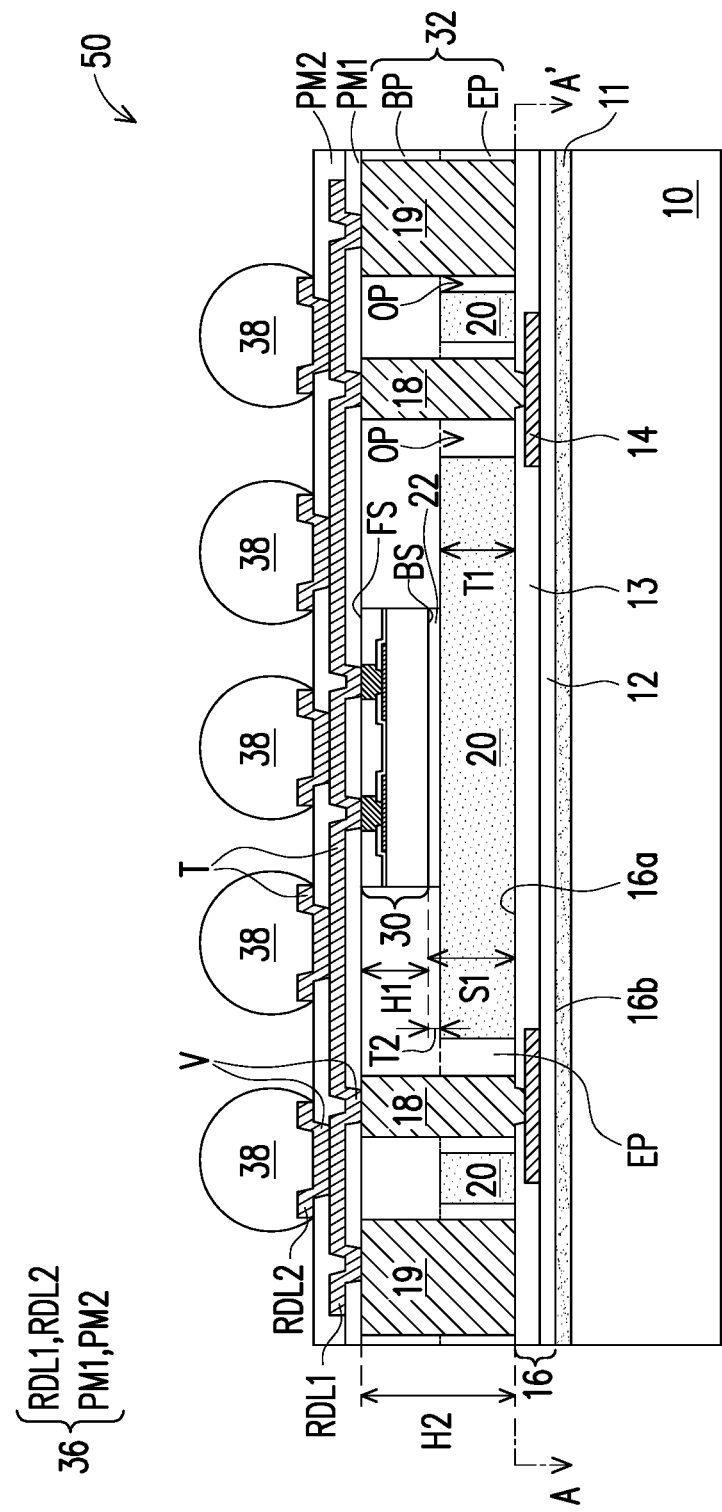

Referring to FIG. 1E, a redistribution layer (RDL) structure 36 is formed on the die 30, the TIVs 18 and 19, and the encapsulant 32. The RDL structure 36 is electrically connected to the die 30 and the TIVs 18 and 19, and further electrically connected to the RDL structure 16 through the TIVs 18. In some embodiments, the RDL structure 16 is referred to as a back-side RDL structure of the die 30, and the RDL structure 36 is referred to as a front-side RDL structure of the die 30. Through the specification, wherein the "front-side" refers to a side close to the connectors 26 of the die 30, and the "back-side" refers to a side opposite to the front-side and is father from the connectors 26 than the front-side.

In some embodiments, the RDL structure 36 includes a plurality of polymer layers PM1, and PM2 and a plurality of redistribution layers RDL1 and RDL2 stacked alternately. The number of the polymer layers or the redistribution layers shown in FIG. 1E is merely for illustration, and the disclosure is not limited thereto. In some embodiments, more than two layers of polymer layers and redistribution layers are included in the RDL structure 36.

The redistribution layer RDL1 penetrates through the polymer layer PM1 and is electrically connected to the connectors 26 of the die 30 and the TIVs 18 and 19. The redistribution layer RDL2 penetrates through the polymer layer PM2 and is electrically connected to the redistribution layer RDL1. The materials and the forming methods of the polymer layers PM1, PM2 and the redistribution layers RDL1, RDL2 of the RDL structure 36 are similar to and may be the same as or different from those of the polymers layer and redistribution layers of the RDL structure 16, respectively, which are not described again.

In some embodiments, the redistribution layers RDL1 and RDL2 respectively includes vias V and traces T connected to each other. The vias V of the redistribution layer RDL1 penetrates through the polymer layer PM1 to connect the traces T to the TIVs 18 and 19 and the connectors 26 of the die 30. The vias V of the redistribution layer RDL2 penetrates through the polymer layer PM2, to connect the traces T of the redistribution layers RDL2 and RDL1. The traces T are respectively located on the polymer layers PM1 or PM2, and are respectively extending on the top surface of the polymer layers PM1 or PM2. The sidewalls of the vias V and the traces T may be straight or inclined. The cross-sectional shape of the via V may be square, rectangle, trapezoid, or the like, but the disclosure is not limited thereto. In some embodiments, the via V has inclined sidewall and is tapered toward the front surface FS of the die 30.

In some embodiments, the redistribution layer RDL2 is the topmost redistribution layer of the RDL structure 36, and is referred to as under-ball metallurgy (UBM) layer for ball mounting.

Still referring to FIG. 1E, a plurality of connectors 38 are formed over and electrically connected to the redistribution layer RDL2 of the RDL structure 36. In some embodiments, the connectors 38 are referred as conductive terminals. In some embodiments, the connectors 38 may be ball grid array (BGA) connectors, solder balls, controlled collapse chip connection (C4) bumps, or a combination thereof. In some embodiments, the material of the connector 38 includes copper, aluminum, lead-free alloys (e.g., gold, tin, silver, aluminum, or copper alloys) or lead alloys (e.g., lead-tin alloys). The connector 38 may be formed by a suitable process such as evaporation, plating, ball dropping, screen printing and reflow process, a ball mounting process or a C4 process. In some embodiments, metal posts or metal pillars (not shown) may further be formed between the redistribution layer RDL2 and the connectors 38, but the disclosure is not limited thereto. The connectors 38 are electrically connected to the connectors 26 of the dies 30 and the TIVs 18 and 19 through the RDL structure 36, and further electrically connected to the RDL structure 16 through the RDL structure 36 and the TIVs 18.

As such, a package structure 50 is thus formed over the carrier 10. In some embodiments, the package structure 50 is a fan-out package structure including the die 30, the film 20, the TIVs 18 and 19, the encapsulant 32, the RDL structures 16 and 36 and the conductive terminals 38.

Figure 1F:
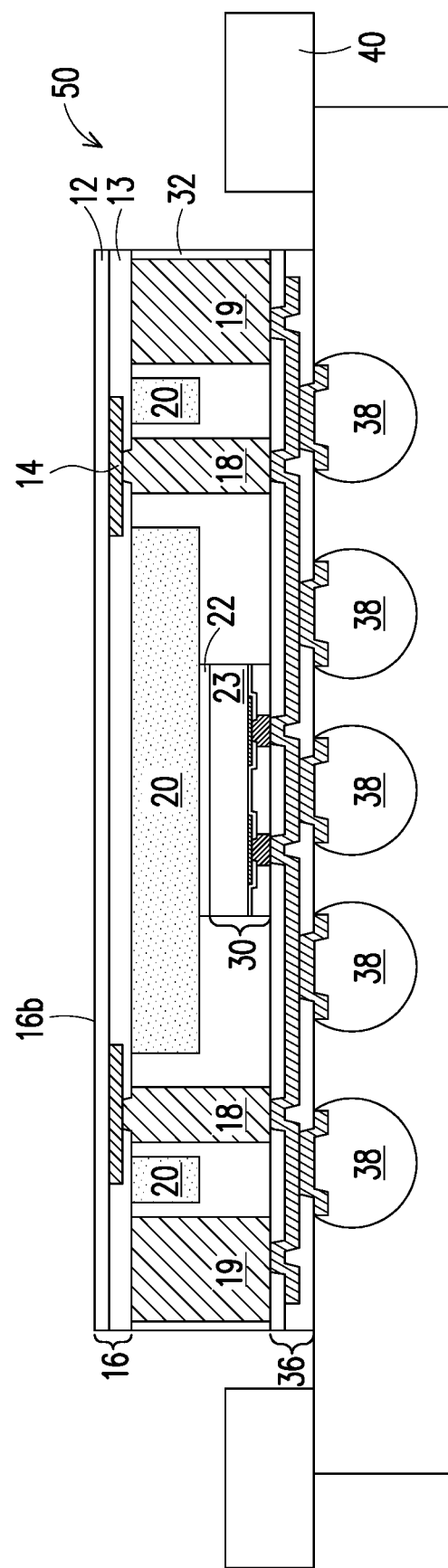
Figure 1G:
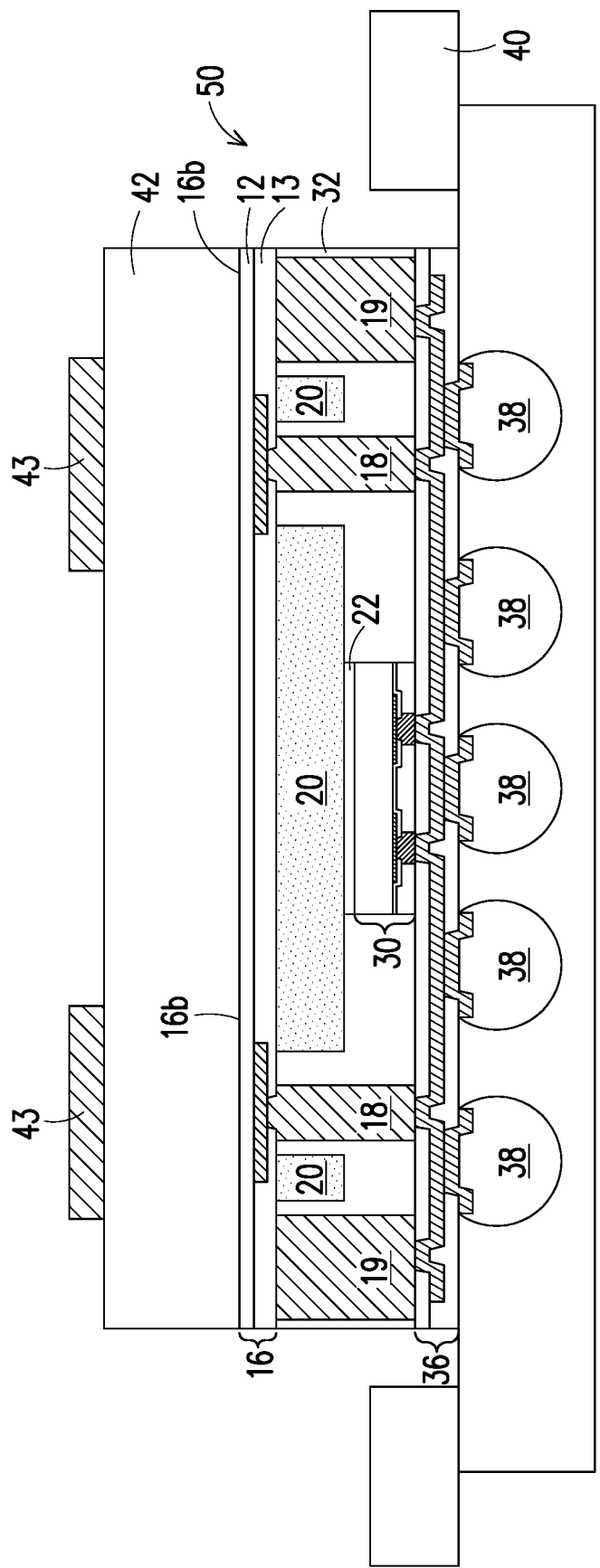
Figure 1H:
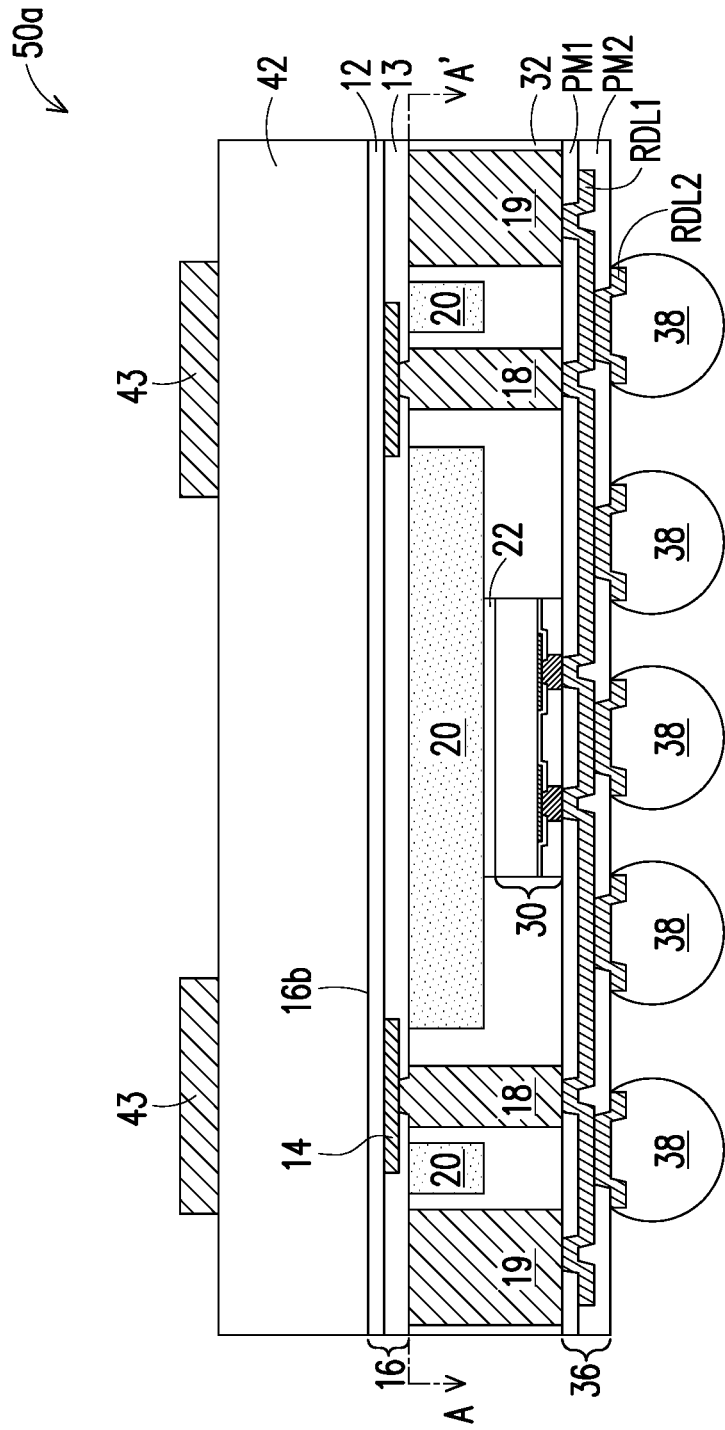
Figure 2:
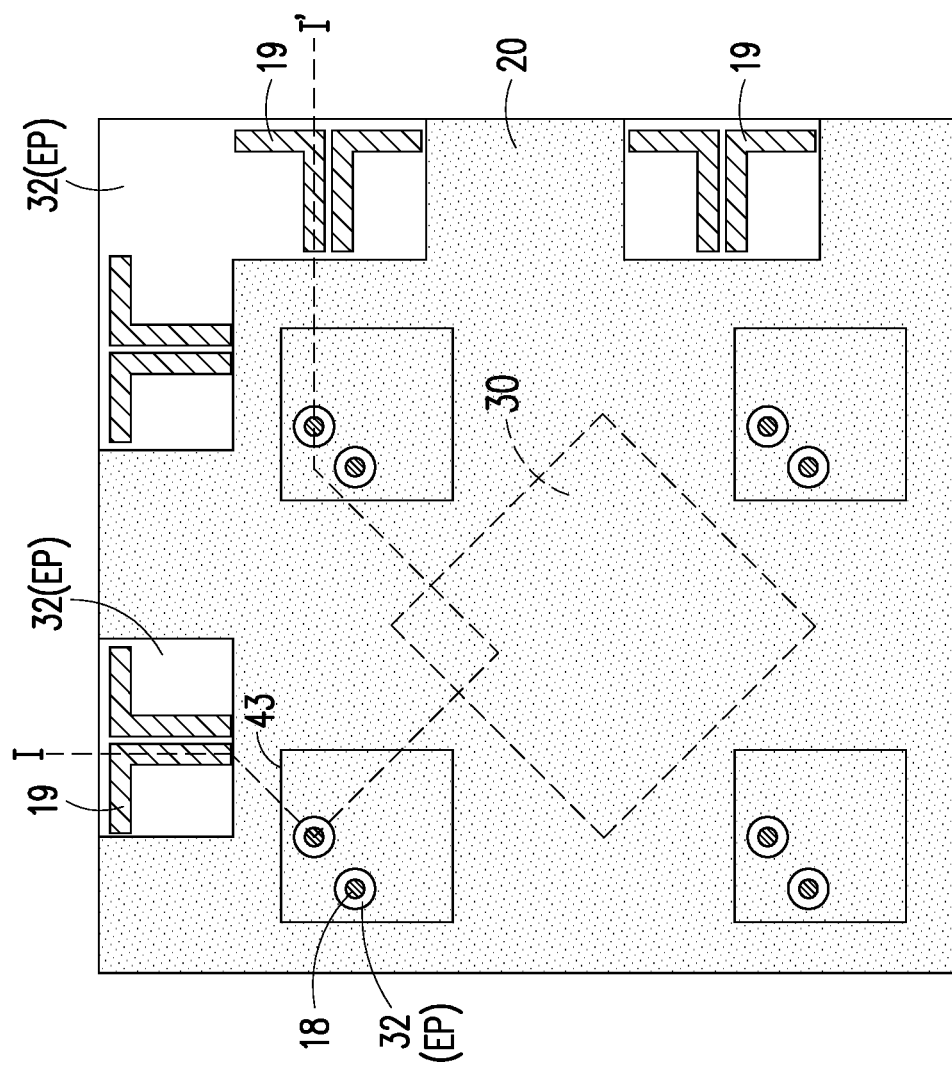
FIG. 2 is a plan view of a package structure according to some embodiments of the disclosure.

FIG. 2 illustrates a plan view of the package structure 50a in a plane along the A-A' of FIG. 1H. FIG. 1H is cross-sectional view along I-I' line of FIG. 2.

Referring to FIG. 1E and FIG. 2, the die 30 is disposed over the RDL structure 16 and the film 20. The adhesive layer 22 is disposed between the die 30 and the film 20. The sidewalls of the die 20 and sidewalls of the adhesive layer 22 are encapsulated by the encapsulant 32. In some embodiments, since the film 20 is disposed between the adhesive layer 22 and the RDL structure 16, the distance S1 between the back surface BS of the die 30 and the first surface (top surface) 16a of the RDL structure 16 (or the bottommost surface of the encapsulant 32) in a direction perpendicular to the back surface BS of the die 30 is larger than the thickness T2 of the adhesive layer 22. The value of the difference between the distance S1 and the thickness T2 of the adhesive layer 22 equals to the thickness T1 of the film 20. In some embodiments, the thickness T2 of the adhesive layer 22 is less than or equal to the thickness T1 of the film 20. For example, the thickness T2 of the adhesive layer 22 ranges from 5 µm to 100 µm.

In some embodiments, the film 20 is disposed between the die 30 and the RDL structure 16, and between the encapsulant 32 and the RDL structure 16. The film 20 has a larger size (such as area) than the die 30 or the adhesive layer 22. The top surface of the film 20 is covered by the encapsulant 32 and the adhesive layer 22. The film 20 includes openings OP for TIVs 18 and 19 penetrating through, and the sidewalls of the film 20 are covered by the encapsulant 32. In other words, the opening OP of the film 20 is filled by the TIVs 18 or 19 and the encapsulant 32, and the sidewalls of the openings OP of the film 20 are covered by the encapsulant 32.

The TIVs 18 and 19 are laterally aside the die 30 and the film 20 and laterally encapsulated by the encapsulant 32. In other words, the TIVs 18 and 19 penetrate through the encapsulant 32 and the film 20 to connect to the RDL structure 36 or/and the RDL structure 16. The TIVs 18 and 19 are surrounded by the encapsulant 32 and the film 20, and the TIVs 18 and 19 are spaced from the film 20 by the encapsulant 32 therebetween. In some embodiments, the height H2 of the TIV 18 or 19 is larger than the sum of the height H1 of the die 30 and the thickness T2 of the adhesive layer 22.

The encapsulant 32 encapsulates sidewalls of the die 30, sidewalls of the adhesive layer 22, sidewalls of the TIVs 18 and 19, sidewalls and top surfaces of the film 20. In some embodiments, the encapsulant 32 includes a body portion BP and multiple extending portions EP. The body portion BP is located on the film 20 and the extending portions EP, encapsulating sidewalls of the die 30, sidewalls of the adhesive layer 22 and first portions (such as, upper portions) of the sidewalls of the TIVs 18 and 19. The extending portions EP extend into the openings OP of the film 20 to encapsulate second portions (such as, lower portions) of the sidewalls of the TIVs 18 and 19. In other words, the extending portions EP of the encapsulant 32 are embedded in the film 20 and surround the TIVs 18 and 19. In some embodiments, the extending portions EP are located between the film 20 and the TIVs 18 and 19, respectively. The extending portion EP between the TIV 18 and the film 20 may be ring-shaped surrounding the TIV 18. Herein, the ring includes circular ring, oval ring, square ring, rectangle ring or any other suitable ring shaped. In some embodiments, the extending portions EP surrounding different TIVs 18 or 19 may be separated from each other by the film 20, but the disclosure is not limited thereto. In alternative embodiments, some of the extending portions EP surrounding different TIVs 18 or 19 may be connected to each other.

Still referring to FIG. 1E, in some embodiments, the bottom surface of the body portion BP of the encapsulant 32 is in physical contact with the top surface of the film 20, and is substantially coplanar with the bottom surface of the adhesive layer 22. The top surface of the body portion BP of the encapsulant 32, the top surface (such as, front surface FS) of the die 30 and the top surfaces of the TIVs 18 and 19 are in physical contact with the RDL structure 36, and are substantially coplanar with each other. The bottom surface of the film 20, the bottom surfaces of the extending portions EP and the bottom surfaces of the TIVs 18 and 19 are in physical contact with the RDL structure 16, and are substantially coplanar with each other. In other words, the bottom surface of the extending portion EP of the encapsulant 32, the bottom surfaces of the TIVs 18 and 19, and the bottom surface of the film 20 are lower than the bottom surfaces of the body portion BP of the encapsulant 32 and the adhesive layer 22.

Still referring to FIG. 1E and FIG. 2, as mentioned above, the film 20 may help to reduce the CTE mismatch between the die 30 and the encapsulant 32. In some embodiments, based on the fan-out ratio, that is, the ratio of the size (e.g. area) of the package structure 50 to the size (e.g. area) of the die 30, the CTE mismatch between the die 30 and the encapsulant 32 may be controlled by adjusting the amount (e.g. volume or thickness) of the film 20 or the ratio between the amount of the film 20 to that of the encapsulant 32. For example, the ratio between the volume of the film 20 to the volume of the encapsulant 32 may range from 0.4 to 0.7.

In some embodiments in which the package structure 50 includes the TIVs 19 which are T1s, antenna elements such as patch antennas may further be formed on the second surface 16b of the RDL structure 16 of the package structure 50.

Referring to FIG. 1E and FIG. 1F, the structure shown in FIG. 1E is turned over and attached to a tape (such as, frame tape) 40. The carrier 10 is then de-bonded from the package structure 50. In some embodiments, the de-bonding layer 11 is decomposed under the heat of light, and the carrier 10 is then released from the RDL structure 16 of the package structure 50. As such, the second surface 16b of the RDL structure 16 is exposed.

Referring to FIG. 1G, in some embodiments, an insulating layer 42 is formed on the second surface 16b of the RDL structure 16. In some embodiments, the insulating layer 42 includes one or more low dissipation factor (Df) and/or low permittivity (Dk) materials. In some embodiments, the insulating layer 42 has a Df lower than 0.01, or/and a Dk in a range of 2 to 4, for example, but the disclosure is not limited thereto. In some embodiments, the insulating layer 42 includes a polymer layer. For example, the insulating layer 42 includes a photo-sensitive material, such as PBO, PI, BCB, a combination thereof, or the like. In alternative embodiments, the insulating layer 42 includes epoxy resins, or any suitable type of molding materials. Depending on the frequency range of high-speed applications, suitable materials of the insulating layer 42 may be selected based on the required electrical properties of the package structure. The insulating layer 42 may be formed by a suitable fabrication technique such as spin-coating, lamination, deposition, or the like.

Still referring to FIG. 1G, thereafter, antenna elements 43 are formed on the insulating layer 42. The antenna elements 43 include conductive materials, such as aluminum, titanium, copper, nickel, tungsten, and/or alloys thereof, or combinations thereof. In some embodiments, the antenna elements 43 are formed by forming a metallization layer (not shown) through electroplating or deposition over the insulating layer 42 and then patterning the metallization layer by a photolithography and etching processes. In some alternative embodiments, the antenna elements 43 may be formed by printing a plurality of metallization patterns directly onto the insulating layer 42. For example, metallic paste may be printed onto the insulating layer 42 and cured to form the antenna elements 43.

In some embodiments, the antenna elements 43 may be electrically coupled to the feed line of the conductive layer 14 of the RDL structure 16. In other words, the signal transmitted in the feed line of the conductive layer 14 may be electrically coupled to the antenna elements 43. In some embodiments, the antenna elements 43 may be referred to as patch antennas.

Referring to FIG. 1G and FIG. 1H, after the antenna elements 43 are formed, the frame tape 40 is removed, and a package structure 50a is thus formed. In some embodiments, the package structure 50a is a fan-out package structure including antenna elements.

Referring to FIG. 1H, in some embodiments, the signals output from the die 30 may be transmitted through portions of the redistribution layer RDL1, the TIVs 18, and the conductive layer 14 in sequential order, and the portions of the redistribution layer RDL1, the TIVs 18, and the conductive layer 14 may be collectively referred to as a feed line. In some embodiments, some of the signals output from die 30 may be transmitted through portions of the redistribution layer RDL1 and gained by the dipole antennas 19. In addition, as amended above, the patch antennas 43 are electrically coupled to the conductive layer 14 of the RDL structure 16, therefore, some of the signals output form the die 30 may be transmitted through portions of the redistribution layer RDL1, the TIVs 18, the conductive layer 14, and gained by the patch antennas 43. In some embodiments, the insulating layer 42 disposed between the RDL structure 16 and the patch antennas 43 and having material properties of low Dk and low Df may be able to provide low loss transmission path, thereby allowing higher gain of the antenna elements 43. In some embodiments, the film 20 between the die 30 and the RDL structure 16 has a suitable thickness, such that a suitable distance is existed between the die 30 and the conductive layer 14 of the RDL structure 16, so as to avoid signal interference.

FIG. 2 also illustrates a projection of the patch antennas 43 on the plane along A-A' according to some embodiments of the disclosure. Referring to FIG. 1H and FIG. 2, in some embodiments, the patch antenna 43 is directly over and overlapped with the conductive layer 14 and the TIV 18 in a direction perpendicular to a front or back surface of the die 30. In other words, the projections of the patch antennas 43 or/and the projections of the conductive layer 14 on the plane A-A' may be overlapped with the TIVs 18. However, the disclosure is not limited thereto.

In the foregoing embodiments, the film 20 is formed before mounting the die 30 and forming the encapsulant 30, and is formed between the die 30 and the RDL structure 16, and between the encapsulant 30 and the RDL structure 16. However, the disclosure is not limited thereto. The film 20 may have any suitable configuration as long as the film 20 occupies a suitable proportion in the package structure to reduce the CTE mismatch between the die 30 and the encapsulant 32. For example, the film 20 may be formed after the formation of the encapsulant 32, or formed both before mounting the die 30 and after the formation of the encapsulant 32. In some embodiments, after the encapsulant 32 is formed, the encapsulant 32 maybe patterned to form one or more holes therein, and the film including comparable CTE material is then filled into the holes.

In some embodiments, the package structure 50 may be free of antenna elements 43 and 19, and may optionally include the TIVs 18 and the back-side RDL structure 16. In some embodiments, the package structure 50 may further be coupled to other package structures to form PoP devices, for example.

In the embodiments of the disclosure, CTE mismatch may be existed between the die and the encapsulant. Comparing with conventional package structure, the package structure of the disclosure includes a film having a comparable CTE material, and the film occupies a portion of the location of encapsulant. In some embodiments, the film has a CTE between the CTE of the die and the CTE of the encapsulant, such as larger than the CTE of the die and less than the CTE of the encapsulant. Therefore, the CTE mismatch is reduced and the warpage of the package structure is thus avoided or reduced, and no additional footprint is needed, that is, the formation of film would not increase the size of the package structure. In addition, the amount of the film material may be adjusted depending on the ratio of the volume of the die to the volume of the encapsulant, which corresponds to the fan-out ratio of the package structure. As such, higher design flexibility is achieved.

In accordance with some embodiments of the disclosure, A package structure includes a conductive feature structure, a die, an adhesive layer, an insulator, a through via, and an encapsulant. The die is disposed over the conductive feature structure. The adhesive layer is disposed below the die. The insulator is disposed between the adhesive layer and a polymer layer of the conductive feature structure. The through via extends through the insulator to connect to the conductive feature structure. The encapsulant is disposed on the insulator and the conductive feature structure, laterally encapsulating the die and the through via, and between the through via and the insulator. The insulator has a coefficient of thermal expansion less than a coefficient of thermal expansion of the encapsulant.

In accordance with some embodiments of the disclosure, a package structure includes an insulator, a die, an adhesive layer, and an encapsulant. The insulator includes a dielectric material. The die is disposed on the insulator. The adhesive layer is disposed between the die and the insulator. The encapsulant is disposed on the insulator and laterally encapsulating sidewalls of the die and the insulator. The insulator has a coefficient of thermal expansion larger than a coefficient of thermal expansion of the die.

In accordance with some embodiments of the disclosure, a method of forming a package structure includes the following processes. A through via is formed on a conductive feature structure. An insulator material is formed on the conductive feature structure. The insulator material is patterned to form an insulator on the conductive feature structure. A die on the insulator is mounted over the conductive feature structure through an adhesive layer. The adhesive layer is below the die, and the insulator is disposed between and in physical contact with the adhesive layer and a polymer layer of the conductive feature structure. An encapsulant is formed on the insulator and the conductive feature structure to laterally encapsulate sidewalls of the die and the through via, and between the through via and the insulator. The insulator has a coefficient of thermal expansion less than a coefficient of thermal expansion of the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a conductive feature structure;
    a die, disposed over the conductive feature structure;
    an adhesive layer, disposed below the die;
    an insulator, disposed between the adhesive layer and a polymer layer of the conductive feature structure;
    a through via, extending through the insulator to connect to the conductive feature structure; and
    an encapsulant, disposed on the insulator and the conductive feature structure, laterally encapsulating the die and the through via, and between the through via and the insulator,
    wherein the insulator comprises a coefficient of thermal expansion less than a coefficient of thermal expansion of the encapsulant.

2. The package structure of claim 1, wherein the insulator has an opening, and an occupied area of the opening is larger than an occupied area of through via.

3. The package structure of claim 1, wherein a top area of the insulator is larger than a top area of the die.

4. The package structure of claim 1, wherein an occupied area of the insulator is less than an occupied area of the conductive feature structure.

5. The package structure of claim 1, wherein a first top surface of the conductive feature structure occupied by the insulator is larger than a second top surface of the conductive feature structure occupied by the encapsulant.

6. The package structure of claim 1, wherein a height of the insulator is less than a height of the encapsulant.

7. The package structure of claim 1, wherein a portion top surface and sidewalls of the insulator is covered by the encapsulant.

8. The package structure of claim 1, wherein the insulator is sandwiched between the encapsulant and the conductive feature structure.

9. The package structure of claim 1, wherein the coefficient of thermal expansion of the insulator is larger than a coefficient of thermal expansion of the die.

10. The package structure of claim 1, wherein the die is disposed within in a die region, and the insulator in the die region is thicker than the insulator in regions other than the die region.

11. A package structure, comprising:
    an insulator, wherein the insulator comprises a dielectric material;
    a die, disposed on the insulator;
    an adhesive layer, disposed between the die and the insulator;
    a through via, extending through the insulator and beside the die; and
    an encapsulant, disposed on the insulator, laterally encapsulating sidewalls of the die and the through via, and between the through via and the insulator,
    wherein the insulator comprises a coefficient of thermal expansion larger than a coefficient of thermal expansion of the die.

12. The package structure of claim 11, wherein the width of the insulator is larger than a width of the adhesive layer.

13. The package structure of claim 11, wherein a top area of the insulator is larger than a top area of the die.

14. The package structure of claim 11, wherein the die is disposed within a die region, and the insulator in the die region is thicker than the insulator in regions other than the die region.

15. The package structure of claim 11, wherein the coefficient of thermal expansion lager of the insulator is less a coefficient of thermal expansion of the encapsulant.

16. A method of forming a package structure, comprising:
    forming a through via on a conductive feature structure;
    forming an insulator material on the conductive feature structure;
    patterning the insulator material to form an insulator on the conductive feature structure;
    mounting a die on the insulator over the conductive feature structure through an adhesive layer, wherein the adhesive layer is below the die, and the insulator is disposed between and in physical contact with the adhesive layer and a polymer layer of the conductive feature structure; and forming an encapsulant on the insulator and the conductive feature structure to laterally encapsulate sidewalls of the die and the through via, and between the through via and the insulator, wherein the insulator comprises a coefficient of thermal expansion-less than a coefficient of thermal expansion of the encapsulant.

17. The method of claim 16, wherein the insulator has an opening and the opening exposes the through via, and the encapsulant fills in the opening.

18. The method of claim 16, wherein a top area of the insulator is larger than a top area of the die.

19. The method of claim 16, wherein a first top surface of the conductive feature structure occupied by the insulator is larger than a second top surface of the conductive feature structure occupied by the encapsulant.

20. The method of claim 16, wherein the encapsulant covers a portion top surface and sidewalls of the insulator.

* * * * *